United States Patent [19]
Berger et al.

[11] Patent Number: 5,777,390
[45] Date of Patent: Jul. 7, 1998

[54] TRANSPARENT AND OPAQUE METAL-SEMICONDUCTOR-METAL PHOTODETECTORS

[75] Inventors: Paul R. Berger, Newark, Del.; Wei Gao, Woburn, Mass.

[73] Assignee: The University of Delaware, Newark, Del.

[21] Appl. No.: 541,525

[22] Filed: Oct. 10, 1995

[51] Int. Cl.$^6$ .................................................... H01L 31/12
[52] U.S. Cl. ...................... 257/749; 257/448; 257/457; 257/81; 257/82
[58] Field of Search ............................. 257/185, 80, 81, 257/82, 83, 458, 449, 448, 457, 21, 97; 372/45, 46, 99, 96

[56] References Cited

U.S. PATENT DOCUMENTS 5,568,499  10/1996  Lear ........................................... 372/45

OTHER PUBLICATIONS

K. Kajiyama, et al., Schottky barrier height of n-$In_xGa_{a-x}As$ diodes, Appl. Phys. Lett., vol. 23, No. 8, 15 Oct. 1973.

D.V. Morgan et al., Increasing the Effective Barrier Height of Schottky Contacts to n-$In_xGa_{1-x}As$, Electronics Letters, 9$^{th}$ Nov. 1978, vol. 14, No. 23.

J. Tersoff, Recent models of Schottky barrier formation, J. Vac. Sci. Technol. B 3 (4), Jul./Aug. 1985.

J. B.D. Soole, et al., VIA-1 High–Speed Response of InAlAs/InGaAs M–S–M Photodetectors at 1.3-and 1.5-μm Wavelengths, IEEE Transactions on Electron Devices vol. 36, No. 11, Nov. 1989.

M. Zirngibl, et al., High sensitive an fast photodetectors at 820 nm, Helvetica Physica Acta, vol. 61 (1988).

H. Schumacher, et al., An Investigation of the Optoelectronic Response of GaAs/InGaAs MSM Photodetectors, Electron Device Letters, vol. 9, No. 11, Nov. 1988.

T. Kikuchi, et al., $Ga_{0.47}In_{0.53}As$ Metal–Semiconductor–Metal Photodiodes Using A Lattice Mismatched $Al_{0.4}Ga_{0.6}As$ Schottky Assist Layer, Electronics Letters, 15$^{th}$ Sep. 1988, vol. 24, No. 19.

W.C. Koscielniak, et al., Dynamic behavior of photocarriers in a GaAs metal–semiconductor–metal photodetector with sub–half–micron electrode pattern, Appl. Phys. Lett. 54(6), 6 Feb., 1989.

A. Temmar, et al., AlInAs/GaInAs Metal–Semiconductor–Metal photodiodes with very low dark current, Microelectronic Engineering 15 (1991), pp. 267–270.

J.H. Burroughes, et al., 1.3 μm InGaAs MSM Photodetector with Abrupt InGaAs/AlInAs Interface, IEEE Photonics Technology Letters, vol. 3, No. 6, Jun. 1991.

G.–K. Chang, et al., A Novel Electronically Switched Four–Channel Receiver Using InAlAs–InGaAs MSM–HEMT Technology for Wavelength–Division–Multiplexing Systems, IEEE Photonics Technology Letters, vol. 3, No. 5, May 1991.

Yi Chen, et al., 375–GHz–bandwidth photoconductive detector, Appl. Phy. Lett. 59 (16), 14 Oct. 1991.

(List continued on next page.)

*Primary Examiner*—Carl W. Whitehead
*Attorney, Agent, or Firm*—Connolly & Hutz

[57] ABSTRACT

An improved metal-semiconductor-metal (MSM) photodiode, specifically a new high responsivity AND high bandwidth photodetector, resulting in a high gain-bandwidth product is disclosed. The disclosed device is an MSM photodiode in which the anode and cathode are made of different materials of differing opacity and possibly including different electrode dimensions as well. Using an opaque anode and a transparent cathode reduces surface reflections off the opaque electrodes allowing more light to be absorbed within the active semiconductor region. However, it concurrently keeps the transit distance for the slower moving holes to a minimum. Thus, the long tail in the impulse response due to hole collection is minimized, resulting in increased bandwidth.

20 Claims, 6 Drawing Sheets

OTHER PUBLICATIONS

Chang–Xin Shi, et al., High–Performance Undoped InP/n–$In_{0.53}Ga_{0.47}As$ MSM Photodetectors Grown by LP–MOVPE, IEEE Transactions on Electron Devices, vol. 39, No. 5, May 1992.

E. Sano, et al., Performance Dependence of InGaAs MSM Photodetectors on Barrier–Enhancement Layer Structure, Electronics Letters, 18$^{th}$ Jun. 1992, vol. 28, No. 13.

Stephen Y. Chou, et al., Nanoscale Terra–Hertz Metal–Semiconductor–Metal Photodetectors, IEEE Journal of Quantum Electronics, vol. 28, No. 10, Oct. 1992.

M.V. Rao, et al., Metal–Semiconductor–Metal Photodetector Using Fe–Implanted $In_{0.53}Gs_{0.47}As$, Electronics Letters, 2$^{nd}$ Jan. 1992, vol. 28, No. 1.

Jong–Wook Seo, et al., A Comparative Study of Metal–Semiconductor–Metal Photodetectors on GaAs with Indium–Tin–Oxide and Ti/Au Electrodes, IEEE Photonics Technology Letters, vol. 4, No. 8, Aug. 1992.

Jae H. Kim, et al., High–Performance Back–Illuminated InGaAs/InAlAs MSM Photodetector with a Record Responsive of 0.96 A/W, IEEE Photonics Technology Letters, vol. 4, No. 11, Nov. 1992.

F. Hieronymi, et al., High–Performance Large–Area InGaAs Metal–Semiconductor–Metal Photodetectors, IEEE Photonics Technology Letters, vol. 5, No. 8, Aug. 1993.

H.J. Lee, et al., Barrier height enhancement of Schottky diodes on–$In_{0.53}Ga_{0.47}As$ by cryogenic process, Appl. Phys. Lett. 63 (14), 4 Oct. 1993.

Y. Hirota, Schottky characteristic of GaAs surface cleaned by ultrasonic running deionized water treatment, Appl. Phys. Lett. 63 (14) 4 Oct. 1993.

P. Fay, et al., 15GHz monolithic MODFET–MSM integrated photoreceiver operating at 1.55 μm wavelength, Electronics Letters, 27$^{th}$ Apr. 1995, vol. 31, No. 9.

Paul R. Berger, et al., $In_{0.53}Ga_{0.47}As$ p–i–n photodiodes with transparent cadmium tin oxide contacts, Appl. Phys. Lett. 61 (14), 5 Oct. 1992.

Wei Gao, et al., $In_{0.53}Ga_{0.47}As$ metal–semiconductor–metal photodiodes with transparent cadmium tin oxide Schottky contacts, Appl. Phys. Lett. 65 (15), 10 Oct. 1994.

Wei Gao, et al., Transparent and opaque Schottky contacts onundoped $In_{0.52}Al_{0.48}As$ grown by molecular beam epitaxy, Appl. Phys. Lett. 68 (25), 19 Jun. 1995.

M. Schuler, Theoretical Models of Schottky Barriers, Thin Solid Films, 93 (1982) 3–9.

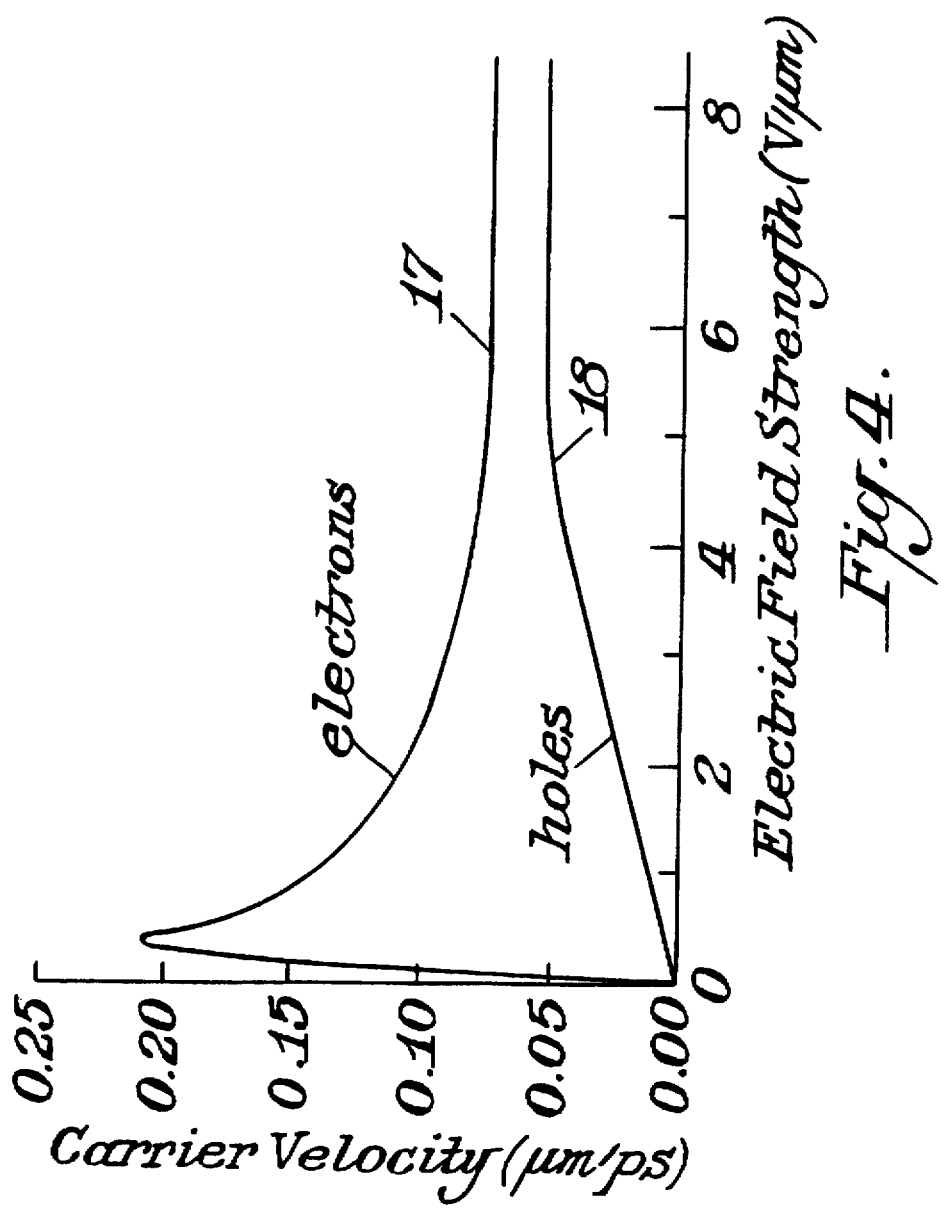

TRANSPARENT AND OPAQUE METAL-SEMICONDUCTOR-METAL PHOTODETECTORS

FIELD OF THE INVENTION

This invention relates to the field of metal-semiconductor-metal photodetectors, and more specifically to a new, improved photodetector which utilizes transparent and opaque electrodes to increase sensitivity and decrease response times. The photodetector has improved responsivity and bandwidth.

DESCRIPTION OF THE PRIOR ART

Metal-semiconductor-metal photodetectors are generally known as high-speed photodetectors and have valuable uses in the fields of communications, research and photography, to name but some of many.

In brief, a metal-semiconductor-metal photodetector is a flat (planar) structure which has several layers. The "base" layer is a semiconductor layer which absorbs photons from a light source. Onto this layer are deposited metal electrodes.

The electrodes are "interdigitated", or alternating, and form Schottky contacts. A Schottky contact is generically defined as a contact point between a metal and a semiconductor, which contact forms a barrier layer at the contact interface resulting in a rectifying current-voltage relationship. Generally, such contacts are extremely difficult to manufacture with a consistent barrier layer value.

Such photodetectors are known to be useful in optical communications systems, such as fiber-optic networks. Transmitted information is detected when incident light is absorbed by the semiconductor medium and the electron-hole pairs created are collected by the external circuit. For such a photodetector, coupling of the photodetector with the fiber optic light source is greatly simplified by the large area and thin nature of the MSM semiconductor. Further, due to their interdigitated nature, electron and hole "pairs" have only a small distance to travel before encountering a conductor, yielding a rapid response time.

MSM photodetectors naturally have a low capacitance per unit area, are easy to fabricate, and are especially suitable for use with field effect transistors. When manufactured in large size, they find application with fiber optic cables, enabling a better coarse alignment than before.

A conventional metal-semiconductor-metal photodetector is as illustrated in prior art FIG. 1.

A semi-insulating base or substrate 10 physically supports the structure and insulates the electrodes from each other and their surroundings. The active layer 11 is the area where photonic conversion to electrons and holes occurs and may be a separate layer or a portion of the semi insulating substrate. Electrodes 12 are deposited onto the surface, and alternate between + and − electrodes in an interdigitated manner.

FIG. 2 is a top plan view illustrating the conventional photodetector. Negative electrode 13 and positive electrode 14 have alternating interdigitated fingers, resulting in a narrow band 15 which allows the entrance of incident light.

A photodetector's effectiveness is measured by its performance in many different parameters. These parameters include dark current, responsivity, speed, and spectral range.

Dark current is generically defined as a current which flows in detectors when there is no radiant flux (light source) incident upon the electrodes. Or, in layman's terms, what is the current generated when there is total darkness. As an aside, this current may vary markedly between materials and temperatures.

Responsivity is the sensitivity of the photodetector, or a measure of how much incident light on the detector is collected and outputted as an external current. Conventional photodetectors are not very responsive, as the electrodes tend to shadow the "active" region of the semiconductor.

Speed of the detector is also a primary consideration. Metal-semiconductor-metal photodetectors have an inherently high speed, as the interdigitated spacing of the electrodes leads to a very low capacitance per unit area. In other words, the speed response is not limited by the resistance and capacitance product (RC time constant), but by the transit time of carriers from their creation point to the electrodes.

Last on the listed four physical qualities deemed most important is the spectral range of the response. As the range of electromagnetic radiation we call light extends from the infrared region (from 0.75 to 1000 microns in wavelength) to the ultraviolet (4000 angstroms to 400 angstroms), the more uniform the photodetector's response is over the spectral range, the better the detector it is.

Standard MSM photodetectors also suffer from a decrease in speed performance because of a "tail" current, which is created by late arriving holes at the electrodes. Such holes move slower through the active region of the photodetector, and can reduce bandwidth.

Regardless of the cause, there has existed a problem surrounding MSM photodetectors in that they are inherently low on the responsivity end. As noted, the electrodes actually "shadow" the active area (admitting light only by way of gap 15), and incident light needed to trigger a response is either reflected or absorbed without effect. An "ideal" metal-semiconductor-metal photodetector is reduced in efficiency by as much as 50% by this shadowing.

A solution to this problem is urgently needed.

DESCRIPTION OF THE PRIOR ART

MSM photodetectors are slow to enter general use because of their current characteristic defects noted above. However, many efforts have been made to improve them.

Various types of materials have been used for the interdigitated "fingers" of the photodetectors to take advantage of the Schottky barrier effect, and different interlayers to take advantage of the variances produced on the contacting surface. Such attempts are discussed at length in my copending application filed on the same day as this application, and entitled "Asymmetric Contacted Metal-Semiconductor-Metal Photodetectors".

None of the work cited in that application discusses using varyingly transparent materials for each different contact, or the preferential placing of translucent/transparent electrodes.

The present inventor's earlier work (Berger et al., "$InO_{0.53}Ga_{0.47}As$ p-i-n photodiodes with transparent cadmium tin oxide contacts", Appl. Phys. Lett. 61 (14) 5 Oct. 1992, p. 1673, involved the development of a new type of p-i-n InGaAs photodiode having an optically transparent composite top electrode with a thin semitransparent metal layer and a transparent Cadmium (Cd) Tin Oxide (CTO) layer. An antireflection coating with these electrodes was said to increase the collection of incident light.

This work was also disclosed in U.S. Pat. No. 5,212,395. The use of optically transparent electrodes was then later applied to MSM photodiodes by the inventors. Gao et al. "$In_{0.53}Ga_{0.47}As$ metal-semiconductor-metal photodiodes with transparent cadmium tin oxide contacts", Appl. Phys.

Lett. 65 (15), 10 Oct. 1994, p. 1930 was a result of this work and is incorporated by reference.

Some of the research to date has attempted light manipulation. Kim et al "High Performance Back-Illuminated InGaAs/InAlAs MSM Photodetector with a Record Responsivity of 0.96 A/W," *IEEE Photonics Technology Letters*, Volume 4, Pages 1241–1244 (1992) avoided the shadowing problem entirely by backside illumination.

However, this technique has drawbacks. Applicants noted one such problem was the distant formation of holes from the gathering electrode.

Other researchers used various forms of transparent electrodes, such as Darling et al. "Epitaxial n+ layer GaAs Mesa-Finger Interdigital Surface Photodetector" *IEEE Electron Device Letters*, Volume 10, pp 461–463 (1989) ($n^+$ transparent layer as conductor); Zirngibl et al "High Sensitive and Fast Photodetectors at 820 nm" *Helv. Phys. Acta*, Volume 61 pp. 845–848 (1988) (indium tin oxide); Seo et al. "A Comparative Study of Metal-Semiconductor-Metal Photodetectors on GaAs with Indium Tin Oxide and Ti/Au Electrodes" *IEEE Photonics Technology Letters*, Volume 4, pp. 888–890 (1992) (indium tin oxide).

The present inventors illustrated the use of cadmium tin oxide as a suitable electrode material. Gao et al. "Long Wavelength Metal-Semiconductor-Metal Photodiodes with Transparent Cadmium Tin Oxide Schottky Contacts" presented at LEOS Summer Topical Meeting on Optoelectronic Materials Growth and Processing. Lake Tahoe, Nev., Jul. 11–13, 1994 and published in *Applied Physics Letters*, Volume 65, pages 1930–1932 (1994), and incorporated by reference.

Although the last few references recognize the importance of providing light access, each suffers by a response delay created. By appropriate selection of opacity versus translucity, and bias applied, responsivity may be increased while speed does not suffer.

SUMMARY OF THE INVENTION

While imaginative, each of the foregoing attempts does not recognize a fundamental advantage can be gained by using two different contacts to make the cathode and the anode. Also, by appropriate selection of the cathode/anode materials, the distance to be traveled by the holes and electrons to the electrodes may be arranged to improve sensitivity without degradation of the bandwidth.

More specifically, in a preferred embodiment, one metal electrode can be chosen which is transparent, and one may be selected which is translucent, and the electrodes can be arranged such as to increase the efficiency of the photodetector. Specifically, transparent electrodes can be utilized for the negative-biased electrodes, and opaque contacts can be used for the positive biased electrodes.

This has the effect of raising the responsivity without reducing the speed, which has heretofore been virtually impossible. As presently understood by the inventors, this is due to the nature of the electrons and holes, and the difference in their path lengths. The electrons have smaller effective mass and larger saturation velocities (i.e. are far more mobile), and therefore may be given longer path lengths. The holes move much more slowly, and therefore are given short path lengths. The creation of the path lengths is by the appropriate selection of the electrode material as to transparency and bias charge applied.

BRIEF DESCRIPTION OF THE DRAWINGS

FIG. 4 is a chart illustrating the carrier velocity plotted against the electric field strength, for both holes and electrons in InGaAs.

DETAILED DESCRIPTION

Generally, interdigitated electrodes are formed by a single photolithography step and successive metal evaporation, which inexpensively results in a cathode-anode structure in which the metal is the same. Applicants propose utilizing a second photolithography step to add a second, transparent metal, to form one of the anodes while the first anode is translucent or less capable of permitting light (photons) to pass.

This second photolithography step will add properties which significantly and unexpectedly advance the field of MSM photodetectors.

Figure 1:
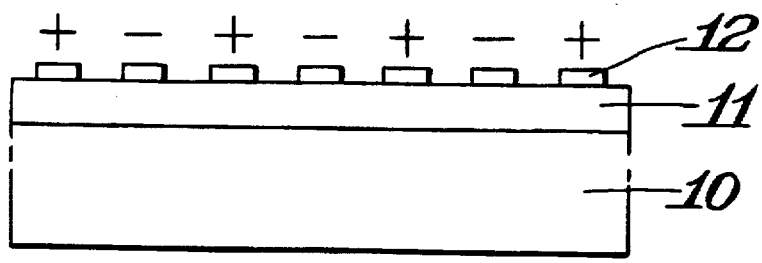
FIG. 1 is a diagrammatic illustration of an MSM photodetector of the prior art.
Figure 2:
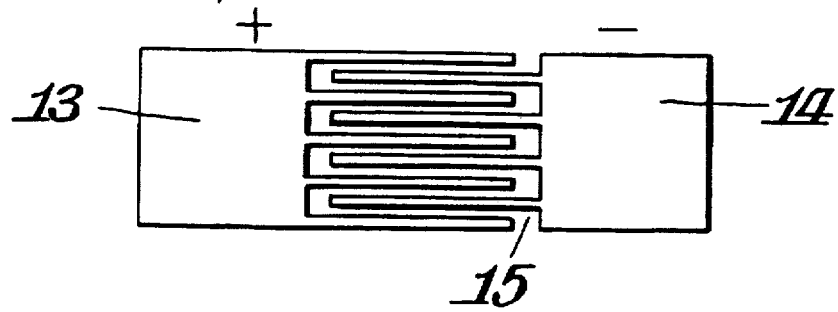
FIG. 2 is a top view diagrammatic illustration of an MSM photodetector of the prior art.

In standard MSM photodetectors (illustrated in FIG. 1) electrons and holes may be generated in any location in the active region 11 where light is incident. If the metal selected is not transparent, the holes and electrons are generally formed somewhat proximate to the destination electrode by default, as the active region is bounded by at least one destination electrode with the appropriate bias charge.

However, the inventors noted that the selection of a transparent electrode resulted in the production of a significant tail end response. This is so because holes are formed under the electrodes themselves. While this is acceptable for those holes formed under the negatively charged electrodes, it is unacceptable for those under the positively charged electrodes.

Figure 3:
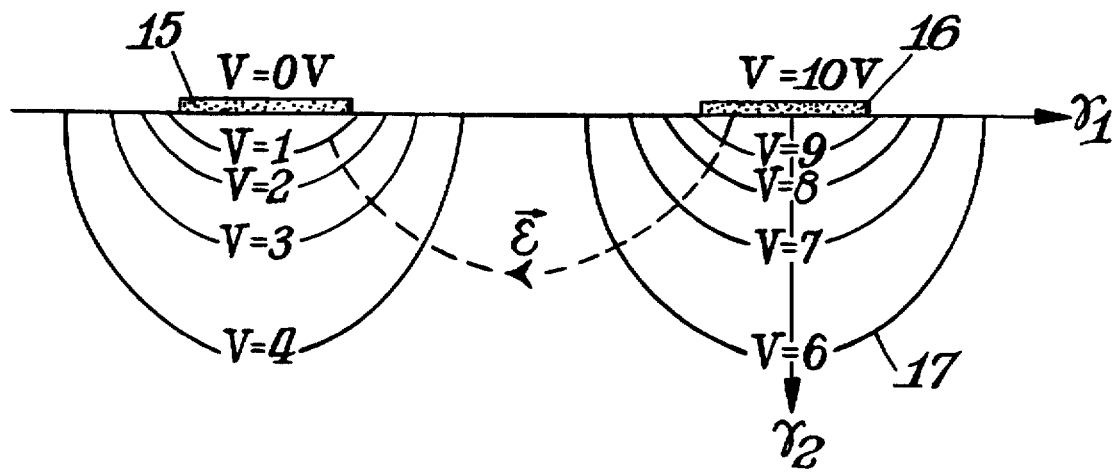
FIG. 3 is a diagrammatic illustration of the potential distribution in a detector with a 10V applied bias.

FIG. 3 illustrates the fundamental reason for this problem. Each of the electrodes has a certain bias potential. For example, electrode 15 has a voltage of 0 volts, while electrode 16 has a voltage of 10 volts. This yields a diminishing field in the semiconductor as illustrated by the field lines on the diagram. The further out the field lines, the less the voltage field. Field line 17 has a voltage of 6 volts.

This field strength voltage has an effect on the travel time of the holes and electrons as illustrated in FIG. 4. Electrons always (except at extremely low voltages) have a significantly higher velocity than holes, as indicated by the placement of line 17 above line 18. At voltages of between 0 and 2 V/micrometer, the velocity can differ by a factor of 100.

Figure 5:
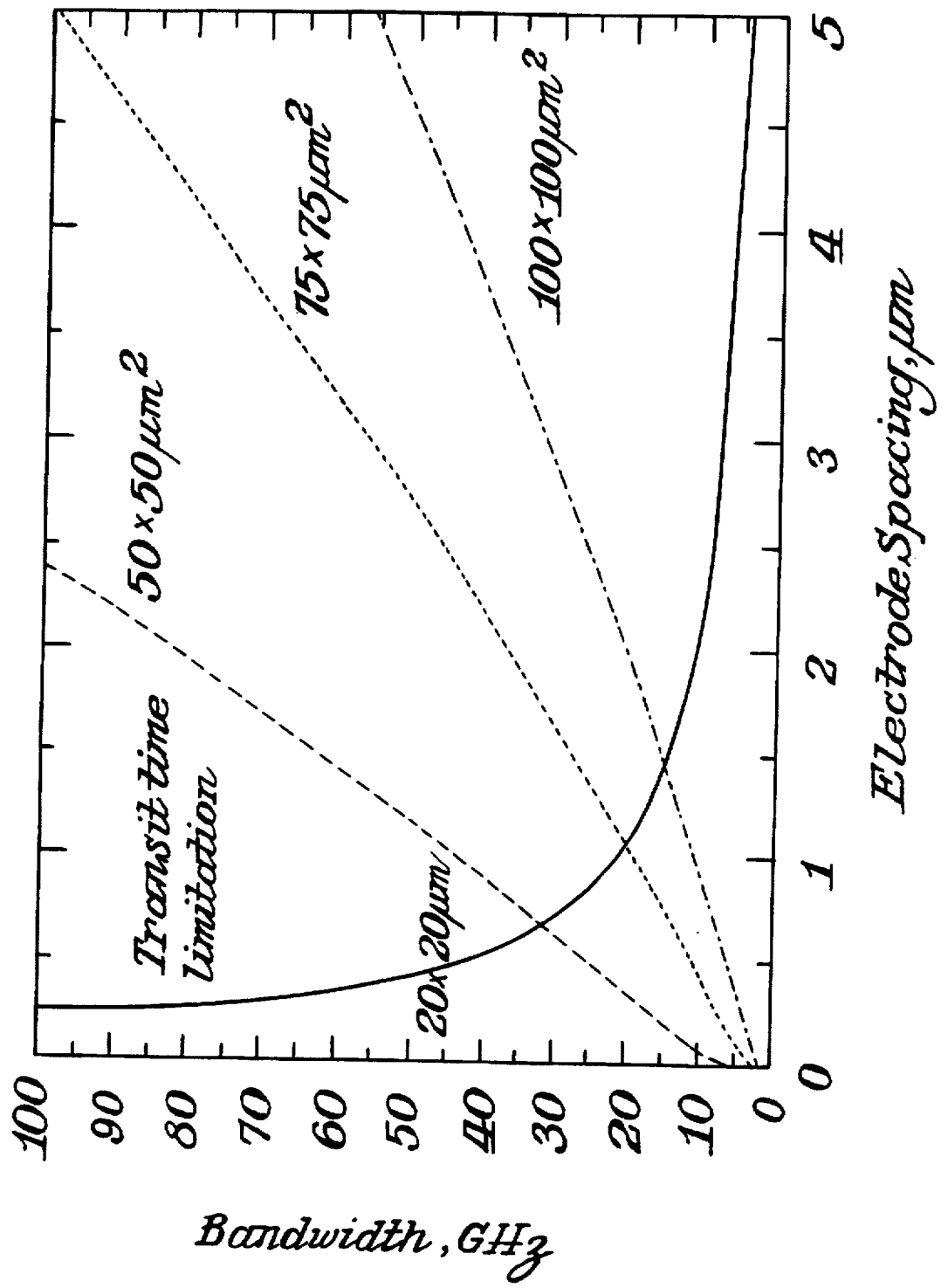
FIG. 5 is a chart illustrating the transit time limitation plotted on a bandwidth/electrode spacing set of axes.

What this means is that the response time is limited by the hole travel speed through the semiconductor material. This can be adjusted by altering the electrode spacing as illustrated in FIG. 5. However, by reducing the electrode spacing, the bandwidth receivable is significantly altered, and the capacitance can be adversely affected. Furthermore, the level of incident light in the semiconductor active region is lowered, as gap 15 (FIG. 1) is closed.

Applicants have developed a photodetector which eliminates this problem. In a photodetector according to the instant invention, transparent and opaque electrodes are alternated. The transparent electrodes are charged negatively to attract holes, and the opaque electrodes are charged positively to attract the electrons.

Figure 6:
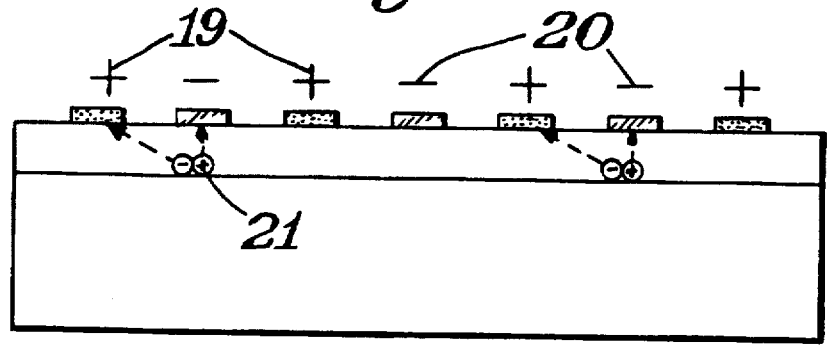
FIG. 6 is a view in side elevation of a photodetector according to the instant invention showing the movement of photo-generated carriers within the active region.

As illustrated in FIG. 6, the positive electrodes 19 are opaque. By opaque, applicants mean that the electrodes may pass no photons, or are selected to restrict the flow of photons.

The lesser the opacity, however, the more incident light is admitted and more sensitive the photodetector. The artisan, having regard for this disclosure, can now fashion many varieties of photodetectors. Applicants have determined that a negative electrode having a transparency of from 50–100% is preferable, with a transparency of from 60–100% being among the most preferred. The positive electrode has a lesser transparency, preferably of from 0–30%, more preferably from 0–20%.

FIG. 6 illustrates the generation of an electron-hole pair in the active region. The hole 21 is directly underneath a transparent electrode, which is negatively charged. The hole, therefore, has a shorter distance to travel than the electron. Being limited by the hole velocity, this enables a better response from the MSM photodetector.

Figure 7:
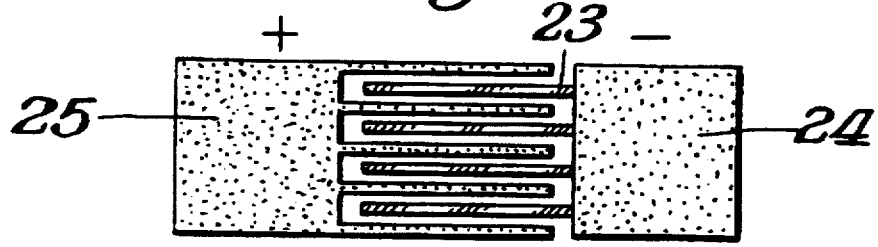
FIG. 7 is a top plan view of a photodetector illustrating a photodetector according to the instant invention.

FIG. 7 illustrates a top view of a preferred embodiment of the instant invention. Transparent electrodes 23 are overlaid with gold in the conducting bar region 24 (off the active region at the pad site), enhancing the speed and conductivity. They are charged negatively and attract the holes. Opaque electrodes 25 are positively charged and attract the electrons, and may also be overlaid with gold in the conducting bar region off of the active region.

Figure 8:
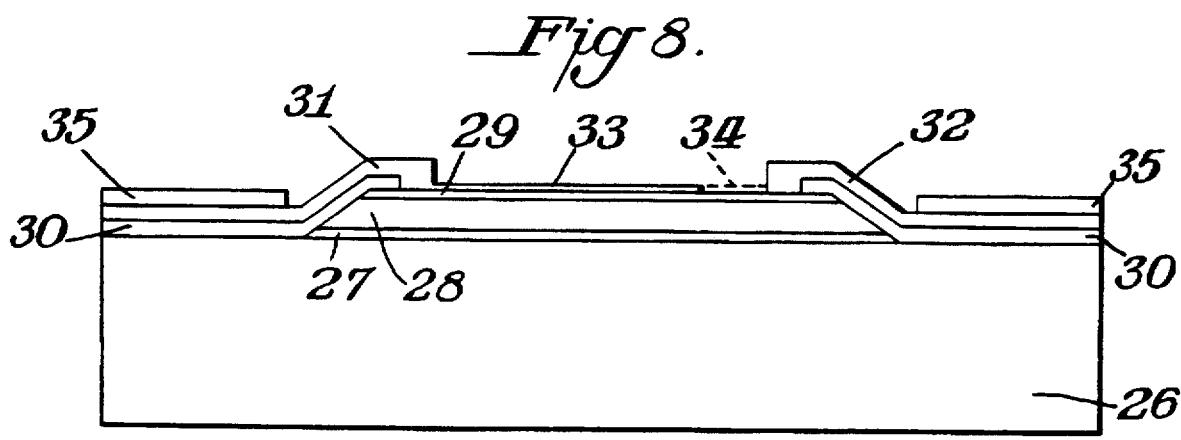
FIG. 8 is a view in side elevation of a preferred photodetector according to the instant invention.

FIG. 8 illustrates a particularly preferred embodiment of the present invention. A semi-insulating substrate 26 is provided with a buffer layer 27, upon which is deposited active layer 28. A barrier enhancement layer 29 is further deposited upon the active layer to raise the Schottky barrier height.

The structure is etched to form a mesa-type structure, and a layer of silicon dioxide 30 is deposited on the entire structure, then removed from the top of the mesa.

Electrode 31 is deposited from a first conducting material, and electrode 32 is deposited from a second conducting material. Fingers 33 from electrode 31 extends outwardly towards electrode 32, and finger 34 (shown in phantom) extends outwardly from electrode 32 towards electrode 31, to give the interdigitated structure.

Overlayer 35 is deposited upon the opaque or transparent electrode to lower series resistance in the conducting bar area. The overlayer may be gold or other suitable highly conductive material.

Optionally, an antireflective coating may be added over the entire structure (and the transparent electrode selected to be high reflective to match the semiconductor), or the electrode which is selected as the substantially transparent electrode may be manipulated to be antireflective.

Figure 9:
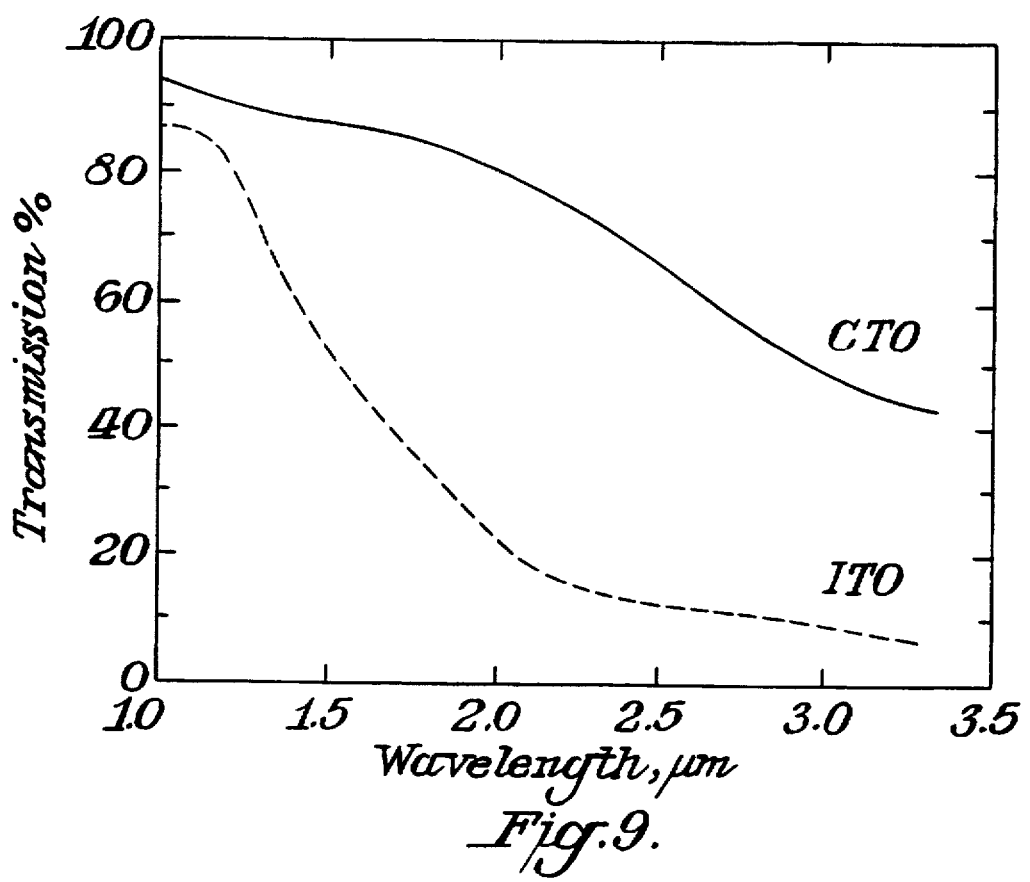
FIG. 9 is a graph indicating the transparency of cadmium tin oxide.

FIG. 9 illustrates the particularly preferred characteristics of cadmium tin oxide (CTO) versus indium tin oxide (ITO). Far greater transparency is observed throughout the 1.0 to 3.5 μm wavelength for CTO than ITO.

Figure 10A:
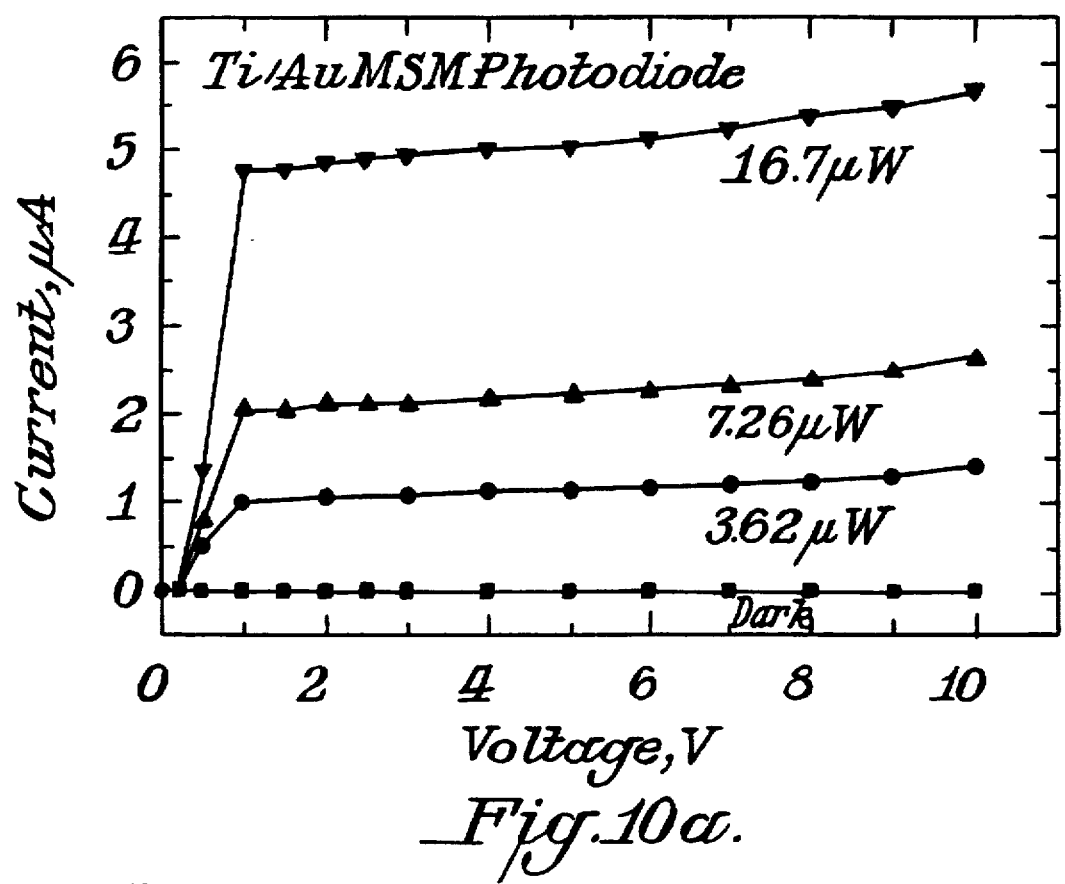
FIG. 10a is a graph indicating the current generated by an InGaAs MSM photodiode with Ti/Au electrodes.
Figure 10B:
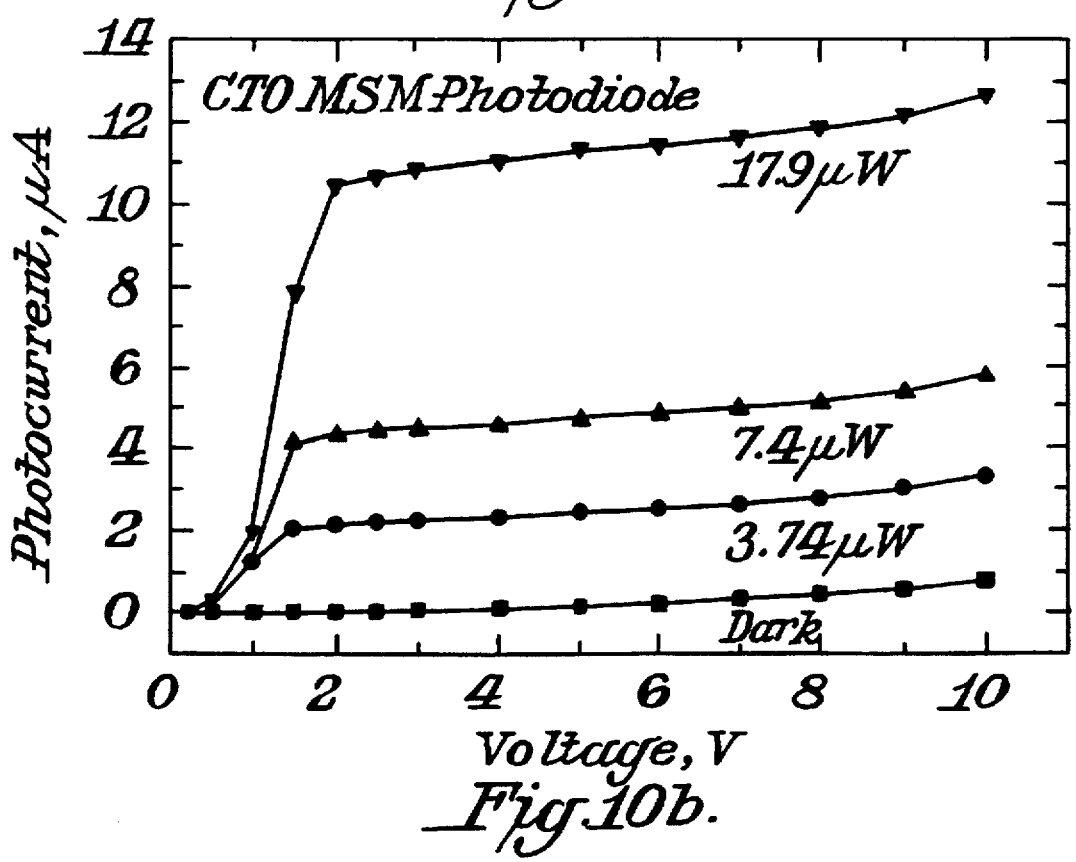
FIG. 10b is a graph indicating the current generated by an InGaAs MSM photodiode with CTO electrodes.

FIG. 10a is a graph illustrating the current generation of a Ti/Au MSM photodiode, while FIG. 10b is a graph illustrating the current generation of a CTO MSM photodiode. The CTO photodiode has superior current generation for the same approximate incident illumination.

Figure 11:
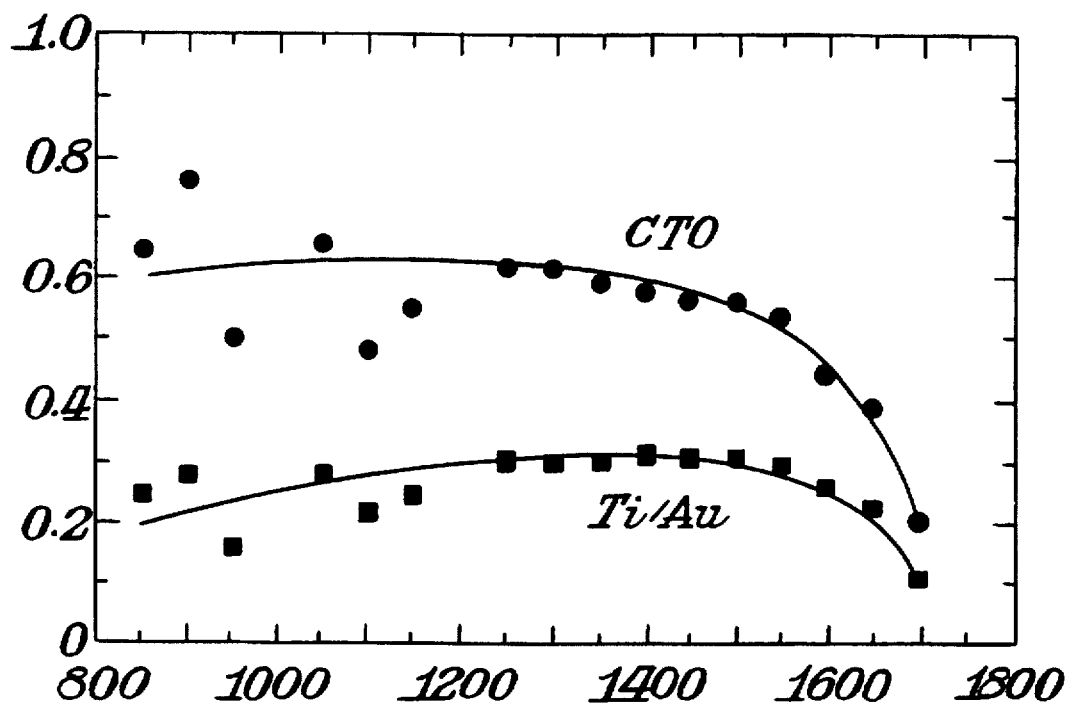
FIG. 11 is a graph illustrating the spectral responsivity of various photodiodes.

FIG. 11 is a graph illustrating the spectral responsivity of CTO MSM photodiodes superimposed over the spectral responsivity of Ti/Au MSM photodiodes, illustrating the superior spectral responsivity of the CTO photodiode.

The "base" or "basic" metals used may be selected from such "pure" metals as Titanium (Ti), Gold (Au), Platinum (Pt), Nickel (Ni), Chromium (Cr), Aluminum (Al) or Silver (Ag). These metals may be of high purity, or alloyed with other metals. Nickel-chromium (NiCr) is one such suitable alloy.

Among the other suitable conductive compounds are refractory metals, such as Molybdenum (Mo), Tantalum (Ta), W, or other suitable metals selectable by those of skill in the art having regard for this disclosure.

Silicide conductors may be utilized, and this enables the artisan to select from a whole host of possible conductors to use as the electrodes in an MSM photodetector according to the instant invention.

Nitrides may also be used in the applications of the present invention. For example, titanium nitride has suitable conducting properties, and others suitable within the scope of this invention may be selected.

The transparent conductors which may be used include (by way of example and not limitation) Cadmium Tin Oxide (CTO), Indium Oxide (IO), Cadmium Oxide (CO), Indium Tin Oxide (CTO), or related oxides.

In the embodiment illustrated by FIG. 6, opaque electrodes are used to collect the electrons and a transparent electrode is used to collect the holes.

This enables the majority of holes to be generated under the transparent electrode (to which they must migrate) and the minority to be generated under the opaque electrode. Electrons can easily migrate much further distances through the semiconductor material, therefore, they may be generated throughout the MSM photodetector without delay problems. An arrangement such as this will allow the absorption of 25% more incident light without concomitant speed reduction.

The production of such electrodes will require an additional photolithography step, as well as the alignment of the cathode and the anode.

A particularly preferred MSM photodiode for use in long distance communications (i.e. 1.30 to 1.55 micrometer wavelength) is as follows. First, the photodiode contains as an active medium InGaAs or InGaAsP.

The photodiode also contains an InP Schottky barrier enhancement layer which is lattice matched. Such a barrier enhancement layer avoids deep levels and impurities associated with aluminum containing compounds. The barrier enhancement layer is preferably graded. Specifically, the active region to the cap layer (InP) is graded to avoid an abrupt heterojunction and the consequential pile up of carriers at the heterointerface. This avoids the subsequent weakening of applied bias level and slower response.

Such a preferred photodiode is favorably grown epitaxially on a semi-insulating Fe-doped (or undoped) InP layer which avoids stray capacitances and the subsequent loss in response. Stray capacitances can be created by the photodiode active region and associated metallizations and a highly doped substrate.

An undoped buffer layer is preferably provided to keep impurities from diffusing into the active region from the lower quality substrate material, and to bend over dislocations propagating up from the substrate and prevent them from passing up into the active region.

The photodiode is preferably fabricated as a "mesa" etched type structure which is physically and electrically isolated from the surrounding structure. This avoids the capacitance problems discussed above and also avoids collection of light in low field areas which contribute to a phenomenon called "slow tail" response, which is the delayed generation of current from more distant regions.

Passivation of the mesa sidewalls with a dielectric material such as silicon dioxide or silicon nitride is preferable and acts to reduce surface leakage current along the mesa sidewalls. It also allows for larger bonding pads to be placed off the mesa, avoiding damage to the photodiode active region when the bonding process is undertaken.

The active region is preferably between 0.5 to 1.50 micrometers thick to ensure maximum reasonable light collection while avoiding collection deep below or distant from the electrodes where the electric field lines tail off. The penetration depth of 1.3 micrometer light is 0.86 microns and for 1.55 micrometer light it is 1.47 microns.

The electrode spacing and widths are preferably of submicron dimensions (i.e. less than 1 micron). This further reduces the transit time of carriers to the electrodes. The most optimal spacing and width is 300 nanometers. Thickness of the electrodes should be at least 50–100 angstroms, and the opaque electrodes are optionally overlaid with a high conductance low resistance metal such as gold to achieve a final thickness of 1000–5000 angstroms during the metallization phase of the photodiode manufacturing.

An antireflection coating is preferably provided to reduce the loss of incident light from surface reflections due to the change in the index of refraction. Optionally, a reflective coating is provided at one surface, and the photodiode can be backlit for a "double pass" which allows light not collected on the first pass to be reflected and collected again.

Most preferably, the MSM photodiode is at least 100 square micrometers, but exceptionally preferred are about 2,500 to 10,000 square micrometers which facilitates coupling of fiber optic cables to the detector.

The electrodes are deposited by a conventional deposition technique. The positive electrode is selected to be at least partially opaque and restrict the incident light, while the negative electrodes are formed from a transparent material and deposited in a separate step.

The negative electrodes are preferably deposited so as to be a thickness whereby they are antireflective (i.e. they act as an antireflective coating by selecting the appropriate index of refraction, wavelength of incident light, and thickness of material).

Having thus described the invention as above, We claim:
1. A photodetector comprising:
   a semiconductor substrate having an active region on one surface thereof,
   a first set of electrodes comprising a first conducting material deposited on the active region of the substrate
   a second set of electrodes comprising a second conducting material deposited on the active region of the substrate, wherein the first set and second set of electrodes are made of different materials having different degrees of opacity.
2. A photodetector as claimed in claim 1, wherein the active region of the substrate is InGaAs, InGaAsP, GaAs, or silicon.
3. A photodetector as claimed in claim 1, wherein the first set of electrodes is negative and more transparent than the second set of electrodes.
4. A photodetector as claimed in claim 3, wherein the negative electrode is a substantially transparent material.
5. A photodetector as claimed in claim 3, wherein the negative electrode is a semi-transparent material.
6. A photodetector as claimed in claim 4, wherein the substantially transparent material is a conducting oxide.
7. A photodetector as claimed in claim 6, wherein the conducting oxide is indium oxide, tin oxide, or cadmium tin oxide.
8. A photodetector as claimed in claim 3, wherein the second set of electrodes is positive.
9. A photodetector as claimed in claim 8, wherein the positive electrode is a metal or silicide.
10. A photodetector as claimed in claim 9, wherein the positive electrode further comprises an additional conducting layer.
11. A photodetector as claimed in claim 10, wherein the additional conducting layer is gold.
12. A photodetector as claimed in claim 1, wherein the first set of electrodes is 50 to 100% transparent.
13. A photodetector as claimed in claim 1, wherein the first set of electrodes is 60 to 100% transparent.
14. A photodetector as claimed in claim 1, wherein the second set of electrodes is from 0–30% transparent.
15. A photodetector as claimed in claim 1, wherein the second set of electrodes is from 0–20% transparent.
16. A photodetector as claimed in claim 8, wherein portions of the negative electrode have a width greater than the corresponding portions of the positive electrode.
17. A photodetector as claimed in claim 8, wherein the width of portions of the negative electrode is from 1 to 50% greater than the width of corresponding protions of the positive electrode.
18. A photodetector as claimed in claim 8, wherein the electrodes are antireflective.
19. A photodetector comprising:
   a semiconductor substrate selected from the group consisting of GaAs, InP, and silicon, said substrate having an active region,
   a barrier enhancement layer on said active region,
   a first set of electrodes deposited on the barrier enhancement layer comprising a first conducting material which has a transparency greater than 50%,
   a second set of electrodes deposited on the barrier enhancement layer comprising a second conducting material which has a transparency of less than 20%,
   an antireflective coating deposited on the top of the photodetector,
   wherein the photodetector has a mesa structure.
20. A photodetector as claimed in claim 19, wherein the mesa has sidewalls which are passivated by deposition of a semi insulating material.

* * * * *